(12) United States Patent
Yamauchi et al.

(10) Patent No.: US 9,791,622 B2
(45) Date of Patent: Oct. 17, 2017

(54) OPTICAL SEMICONDUCTOR RESONATOR, OPTICAL SEMICONDUCTOR DEVICE, AND OPTICAL MODULE

(71) Applicant: OCLARO JAPAN, INC., Kanagawa (JP)

(72) Inventors: Syunya Yamauchi, Kanagawa (JP); Atsushi Nakamura, Nagano (JP); Yoshihiro Tsunemi, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 0 days.

(21) Appl. No.: 15/147,119

(22) Filed: May 5, 2016

(65) Prior Publication Data

US 2016/0252676 A1    Sep. 1, 2016

Related U.S. Application Data

(63) Continuation-in-part of application No. 14/480,877, filed on Sep. 9, 2014, now Pat. No. 9,335,483.

(30) Foreign Application Priority Data

Sep. 12, 2013   (JP) ................................. 2013-188976

(51) Int. Cl.
   *G02B 6/124*   (2006.01)
   *H01S 5/10*    (2006.01)
   (Continued)

(52) U.S. Cl.
   CPC ............ *G02B 6/124* (2013.01); *H01S 5/0265* (2013.01); *H01S 5/106* (2013.01); *H01S 5/1231* (2013.01);
   (Continued)

(58) Field of Classification Search
   CPC ...................... G02B 6/124; G02B 6/34; G02B 2006/12107; G02B 2006/12142;
   (Continued)

(56) References Cited

U.S. PATENT DOCUMENTS 5,033,812 A * 7/1991 Yoshida ................... G02B 6/34
                                                 385/37
5,070,488 A * 12/1991 Fukushima ............ G02B 6/124
                                                 359/571
(Continued)

FOREIGN PATENT DOCUMENTS

DE   WO 02073267 A1 * 9/2002  ......... G02B 6/12014
JP        2000-261093 A      9/2000
(Continued)

OTHER PUBLICATIONS

Japanese Office Action received in corresponding Japanese Application No. 2013-188976 dated Feb. 21, 2017.

*Primary Examiner* — Peter Radkowski
(74) *Attorney, Agent, or Firm* — Mattingly & Malur, PC

(57) ABSTRACT

In order to prevent non-uniformity in emission wavelength among different sites along an optical axis direction, provided is a resonator portion including: a waveguide which includes a first area and a second area being adjacent to the first area; and diffraction gratings formed along an optical axis direction. The effective refraction index in the first area is larger than the one in the second area, and the thickness in the first area is larger than the one in the second area. A pitch at the adjacent diffraction gratings at a boundary between the first area and the second area is narrower both than pitches of the diffraction gratings that are formed in the first area and than pitches of the diffraction gratings that are formed in the second area.

13 Claims, 10 Drawing Sheets

(51) Int. Cl.
  *H01S 5/12*   (2006.01)
  *H01S 5/026*  (2006.01)
  *G02B 6/12*   (2006.01)

(52) U.S. Cl.
  CPC .............. *G02B 6/12004* (2013.01); *G02B 2006/12107* (2013.01); *G02B 2006/12121* (2013.01); *G02B 2006/12142* (2013.01); *H01S 5/1212* (2013.01); *H01S 2301/02* (2013.01)

(58) Field of Classification Search
  CPC ...... H01S 5/0265; H01S 5/106; H01S 5/1231; H01S 5/227; H01S 5/1212; H01S 2301/02
  See application file for complete search history.

(56) References Cited

U.S. PATENT DOCUMENTS

| | | | | |
|---|---|---|---|---|
| 5,208,800 | A * | 5/1993 | Isobe ..................... | G02B 6/126 369/112.27 |
| 5,224,195 | A * | 6/1993 | Yoshida ................. | G02F 1/377 359/326 |
| 5,428,635 | A * | 6/1995 | Zhiglinsky ........ | H01S 3/094034 372/102 |
| 5,668,047 | A * | 9/1997 | Muroya .................... | H01S 5/12 148/DIG. 95 |
| 6,285,813 | B1 * | 9/2001 | Schultz .................... | G02B 6/34 359/575 |
| 6,415,081 | B1 * | 7/2002 | Levner ............... | G02B 6/02085 385/123 |
| 6,455,338 | B1 * | 9/2002 | Takagi .................. | H01S 5/0265 438/24 |
| 6,526,087 | B1 | 2/2003 | Okuda | |
| 6,603,138 | B2 * | 8/2003 | Arakawa ............... | H01S 5/0265 257/12 |
| 6,647,032 | B1 * | 11/2003 | Lee ........................ | H01S 5/026 372/20 |
| 6,782,164 | B1 * | 8/2004 | Lee ........................ | G02B 6/124 372/20 |
| 6,888,986 | B2 * | 5/2005 | Ovadia .............. | H04B 10/2519 385/10 |
| 7,062,131 | B2 * | 6/2006 | Ilchenko ............ | G02B 6/12007 385/28 |
| 7,397,987 | B2 * | 7/2008 | Witzens ................. | G02B 6/124 385/14 |
| 7,627,018 | B1 * | 12/2009 | Guilfoyle ............. | G02B 6/4214 372/102 |
| 8,457,452 | B2 * | 6/2013 | Hashimoto ............ | B82Y 20/00 359/332 |
| 8,472,760 | B2 * | 6/2013 | Hashimoto ............ | G02B 6/122 359/332 |
| 8,573,785 | B2 * | 11/2013 | Kuksenkov ............ | G03B 21/40 353/122 |
| 8,588,266 | B2 * | 11/2013 | Fujii ..................... | H01S 5/0612 372/102 |
| 9,166,368 | B2 * | 10/2015 | Kanskar ................ | H01S 5/1014 |
| 2001/0034071 | A1 * | 10/2001 | Arakawa ............... | H01S 5/0265 438/22 |
| 2004/0156590 | A1 * | 8/2004 | Gunn, III ............. | G02B 6/1228 385/37 |
| 2004/0184156 | A1 * | 9/2004 | Gunn, III ............. | G02B 6/1228 359/629 |
| 2004/0252738 | A1 * | 12/2004 | Hill ........................ | B82Y 15/00 372/43.01 |
| 2005/0147355 | A1 * | 7/2005 | Ilchenko ............ | G02B 6/12007 385/50 |
| 2005/0286832 | A1 * | 12/2005 | Witzens ................. | G02B 6/124 385/37 |
| 2006/0051022 | A1 * | 3/2006 | Levner ................. | G02B 5/1828 385/37 |
| 2007/0036188 | A1 * | 2/2007 | Fujii ........................ | H01S 5/12 372/50.11 |
| 2007/0196047 | A9 * | 8/2007 | Levner ................. | G02B 5/1828 385/37 |
| 2011/0091147 | A1 * | 4/2011 | Hashimoto ............ | B82Y 20/00 385/2 |
| 2011/0091151 | A1 * | 4/2011 | Hashimoto ............ | G02B 6/122 385/14 |
| 2012/0027349 | A1 * | 2/2012 | Fiorentino ........ | B29D 11/00298 385/37 |
| 2012/0127437 | A1 * | 5/2012 | Kuksenkov ............ | G03B 21/40 353/31 |
| 2013/0089115 | A1 * | 4/2013 | Kanskar ................ | H01S 5/1014 372/45.01 |
| 2015/0285996 | A1 * | 10/2015 | Selvaraja ................ | G02B 6/30 385/14 |

FOREIGN PATENT DOCUMENTS

| | | |
|---|---|---|
| JP | 2002-353559 A | 12/2002 |
| JP | 2003-69136 A | 3/2003 |
| JP | 2003-218462 A | 7/2003 |
| JP | 2013-051319 A | 3/2013 |

* cited by examiner

OPTICAL SEMICONDUCTOR RESONATOR, OPTICAL SEMICONDUCTOR DEVICE, AND OPTICAL MODULE

CROSS-REFERENCE TO RELATED APPLICATION

This application is a continuation-in-part of U.S. patent application Ser. No. 14/480,877, filed on Sep. 9, 2014, which claims priority from Japanese application JP 2013-188976 filed on Sep. 12, 2013, the entire contents of which are hereby incorporated by reference into this application.

BACKGROUND OF THE INVENTION

1. Field of the Invention

The present invention relates to an optical semiconductor resonator, an optical semiconductor device, and an optical module.

2. Description of the Related Art

Some optical semiconductor devices for use in optical communication integrate a resonator portion and a modulator portion among others in one device. This type of optical semiconductor device is manufactured by, for example, a method known as butt-joint (hereinafter abbreviated as BJ) growth in which a multilayer structure such as a multiple-quantum well structure of the modulator portion is formed by crystal growth throughout a wafer, an area that ultimately becomes the modulator portion is masked, other areas than the masked area are removed by etching, and then a multi-layer structure of the resonator portion is formed by crystal growth throughout the wafer.

In the case where an optical semiconductor device is manufactured through a BJ growth step, the selective area growth effect (hereinafter referred to as SAG effect) of the modulator area mask, for example, influences the characteristics of the optical semiconductor device. For instance, as described in Japanese Patent Application Laid-open No. 2013-51319, it is a known fact that the photoluminescence (hereinafter abbreviated as PL) wavelength of an optical waveguide varies depending on its location with respect to an end of the mask.

The resonator portion (laser portion) integrated in an optical semiconductor device needs to secure stability in emission wavelength in order to enhance optical communication quality. It is therefore necessary to keep the side-mode suppression ratio (SMSR) at a certain level or higher so that the oscillation mode does not change in the case of a change in drive current applied to the laser portion or in the case of deterioration with time of the laser portion.

However, when the laser portion is formed by BJ growth in the manner described above, the SAG effect of the BJ mask causes the laser multilayer to increase in film thickness toward the end of the BJ mask from a rear end surface of the laser portion, resulting in non-uniform composition wavelength in the optical axis direction. Consequently, an effective refraction index n of the laser is non-uniform in the optical axis direction, which makes a DFB wavelength $\lambda_{DFB}$ expressed as $2n\Lambda$ ($\Lambda$ represents the diffraction grating pitch) non-uniform in the optical axis direction. With the effective refraction index being non-uniform in the optical axis direction, in a case of distributed feedback (DFB) lasers, for example, the frequency symmetry of the threshold gain is lost in each longitudinal mode and the threshold gain decreases on the side where the frequency is low. This reduces a threshold gain difference between a zero-order oscillation mode where the threshold gain is minimum and a longitudinal mode (sub-mode) where the threshold gain is second smallest. In other words, this reduces an intensity difference between the zero-order oscillation mode and the sub-mode, which may lower the SMSR yield.

SUMMARY OF THE INVENTION

The present invention has been made in view of the problem described above, and an object of the present invention is therefore to provide an optical semiconductor resonator, an optical semiconductor device, and an optical module which are capable of preventing non-uniformity in emission wavelength among different sites along an optical axis direction.

In order to achieve the above-mentioned object, (1) an optical semiconductor resonator according to one embodiment of the present invention includes: a waveguide which includes at least two areas where an effective refraction index varies in an optical axis direction; and diffraction gratings formed along the optical axis direction of the waveguide, in which the diffraction grating that is formed in one of the at least two areas of the waveguide where the effective refraction index is large has a pitch narrower than a pitch of the diffraction grating that is formed in another of the at least two areas of the waveguide where the effective refraction index is small.

(2) In the optical semiconductor resonator according to Item (1), the waveguide may include at least two areas where a thickness varies in the optical axis direction, and the diffraction grating that is formed in one of the at least two areas of the waveguide where the thickness is large may have a pitch narrower than a pitch of the diffraction grating that is formed in another of the at least two areas of the waveguide where the thickness is small.

(3) In the optical semiconductor resonator according to Item (1), the waveguide may include at least two areas where a photoluminescence wavelength varies in the optical axis direction, and the diffraction grating that is formed in one of the at least two areas of the waveguide where the photoluminescence wavelength is long may have a pitch narrower than a pitch of the diffraction grating that is formed in another of the at least two areas of the waveguide where the photoluminescence wavelength is short.

(4) The optical semiconductor resonator according to any one of Items (1) to (3) may further include a mesa stripe structure along the waveguide.

(5) In the optical semiconductor resonator according to any one of Items (1) to (4), a difference in emission wavelength between a front end of the waveguide and a rear end of the waveguide may be within ±2 nm.

(6) An optical semiconductor device according to one embodiment of the present invention includes an optical modulator connected to the optical semiconductor resonator according to any one of Items (1) to (5) by a butt-joint structure.

(7) In the optical semiconductor device according to Item (6), in the optical semiconductor resonator, the diffraction grating that is formed in one of the at least two areas of the waveguide where a distance from a connection portion connecting to the optical modulator is short may have a pitch narrower than a pitch of the diffraction grating that is formed in another of the at least two areas of the waveguide where the distance from the connection portion is long.

(8) In the optical semiconductor device according to Item (6), in the optical semiconductor resonator, of the diffraction gratings that are formed within a given range from a connection portion connecting to the optical modulator, the diffraction grating that is formed in one of the at least two areas of the waveguide where the effective refraction index is large may have a pitch narrower than a pitch of the diffraction grating that is formed in another of the at least two areas of the waveguide where the effective refraction index is small, and the diffraction gratings that are formed in other areas of the optical semiconductor resonator than the given range may have a uniform pitch.

(9) An optical module according to one embodiment of the present invention includes the optical semiconductor resonator according to any one of Items (1) to (5), or the optical semiconductor device according to any one of Items (6) to (8).

According to one embodiment of the present invention, non-uniformity in emission wavelength can be prevented by varying the pitch of the diffraction gratings that are provided in the optical axis direction of the optical semiconductor resonator depending on the effective refraction index of the semiconductor layer. The SMSR is thus kept from dropping.

DETAILED DESCRIPTION OF THE INVENTION

Modes of carrying out the present invention (hereinafter referred to as embodiments) are described below with reference to the accompanying drawings.

Figure 1A:
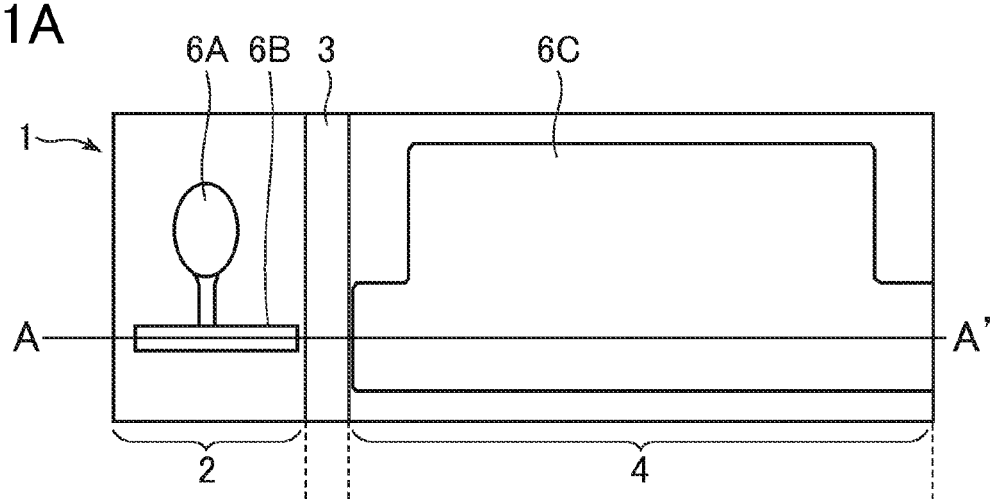
FIG. 1A and FIG. 1B are a plan view of an optical semiconductor device according to embodiments of the present invention and a sectional view of the optical semiconductor device taken along the line A-A', respectively.
Figure 1B:
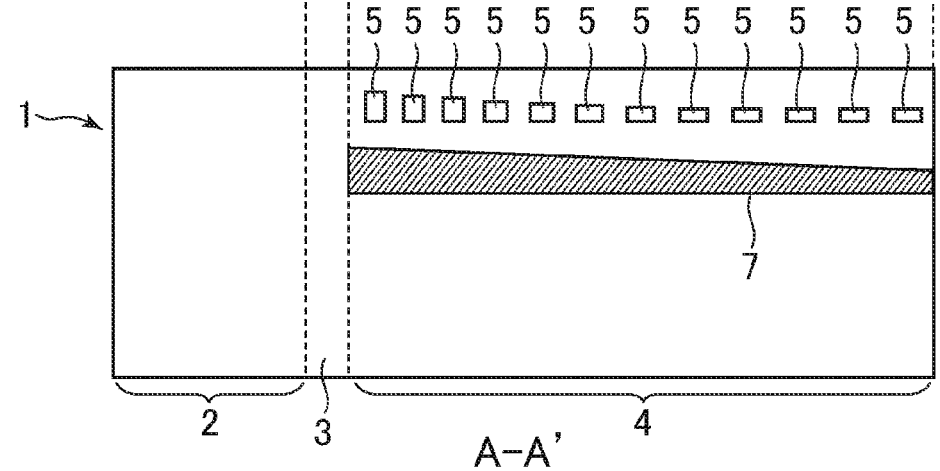

FIG. 1A is a plan view of an optical semiconductor device 1 that includes an optical semiconductor resonator according to the embodiments of the present invention. FIG. 1B is a sectional view along an optical axis of the optical semiconductor device which is taken along the line A-A' of the plan view of FIG. 1A.

In FIGS. 1A and 1B, the optical semiconductor device 1 includes a modulator portion (an optical modulator) 2, an isolation portion 3, a resonator portion 4 which emits laser light (the optical semiconductor resonator), diffraction gratings 5, electrodes 6A, 6B, and 6C for applying a voltage and a current to the modulator portion 2 and the resonator portion 4, and an active layer 7. The electrode 6A is a pad electrode provided above the modulator portion 2. The electrode 6B is connected to the pad electrode and is provided along an optical waveguide of the modulator portion 2. The electrode 6C is provided above the resonator portion 4. While FIGS. 1A and 1B illustrate an example in which the optical semiconductor device is provided with the isolation portion 3, the resonator portion 4 and the modulator portion 2 may be joined instead of providing the isolation portion 3. A wire may be bonded to the electrodes 6 (6A and 6C). The modulator portion 2 modulates laser light incident from the resonator portion 4, and causes the modulated laser light to exit from a front end surface (the A side) as a modulated optical signal.

A method of manufacturing the optical semiconductor device (EA/DFB laser) of FIGS. 1A and 1B is outlined.

First, multilayer growth of the modulator portion 2 (an EA portion) is performed on an InP substrate, a $SiO_2$ mask is used to etch away the layers except the modulator portion 2 (the EA portion), and multilayer growth of the resonator portion 4 (an LD portion) is performed. The thickness of the resonator portion 4 at this point is non-uniform in the optical axis direction due to the selective area growth (SAG) effect of the mask. Thereafter, a $SiO_2$ mask is used to etch away the layers except the modulator portion 2 and the resonator portion 4, and multilayer growth of the isolation portion 3 is performed. A mask formed by electron beam lithography is then used to form a diffraction grating layer that includes a plurality of diffraction gratings arranged at diffraction grating pitches that are suited to effective refraction indices at their locations. Subsequently, multilayer growth of an upper cladding layer and a contact layer is performed. A mesa stripe is further formed, and a semi-insulating InP embedded layer is formed as well. Lastly, a passivation film is formed on the semiconductor surface, a through hole is opened, and an electrode layer for establishing electrical connection is formed, to thereby complete the manufacture of the optical semiconductor device 1 of FIGS. 1A and 1B.

In the optical semiconductor device 1 of FIGS. 1A and 1B which includes the modulator portion 2 and the resonator portion 4, the active layer 7 is thicker toward a BJ connection portion (a portion connecting the modulator portion 2 and the resonator portion 4) due to the SAG effect of the BJ mask as illustrated in the sectional view of FIG. 1B.

Figure 4:
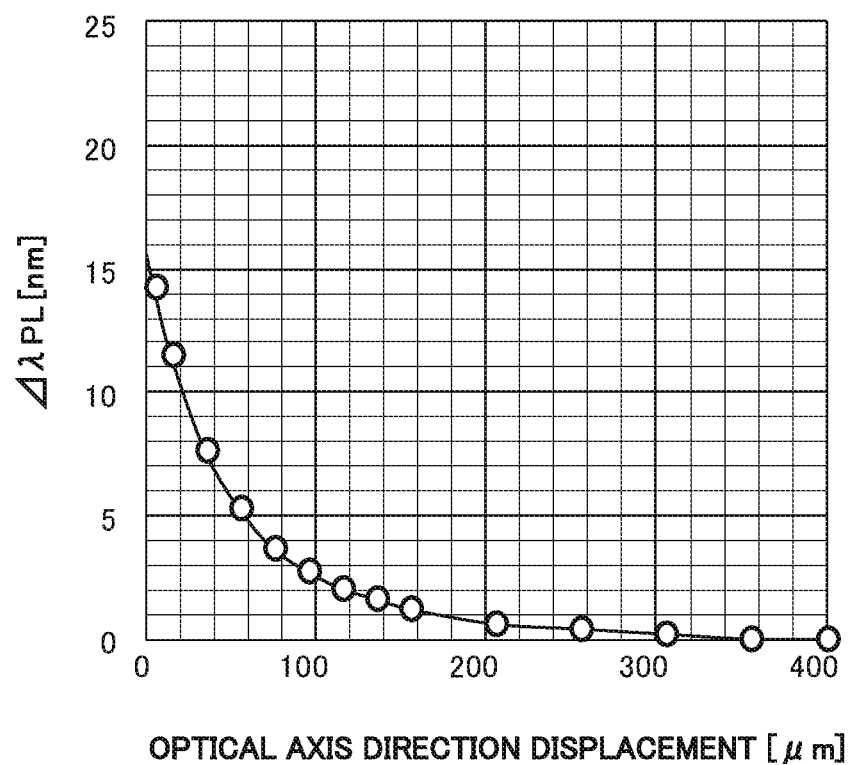
FIG. 4 is a graph showing the relation between optical axis direction displacement and a PL wavelength difference $\Delta\lambda_{PL}$ in an optical semiconductor device that has a BJ connection portion.

FIG. 4 shows a relation between optical axis direction displacement and a PL wavelength difference $\Delta\lambda_{PL}$ in the optical semiconductor device 1 which includes the modulator portion 2 and the resonator portion 4 and which has been manufactured through a BJ growth step. In FIG. 4, the optical axis direction displacement represented by the axis of abscissa is 0 at the connection portion between the modulator portion 2 and the resonator portion 4, and is expressed as the distance from the connection portion to the rear end side (the A' side). The PL wavelength $\lambda_{PL}$ uses a value at the rear end (the A' side) as a reference, and the PL wavelength difference $\Delta\lambda_{PL}$ represented by the axis of ordinate in FIG. 4 indicates a wavelength difference between the PL wavelength at a point of optical axis direction displacement and the PL wavelength at the rear end. Because the thickness of the resonator portion 4 increases toward the BJ connection portion which is a portion connecting the modulator portion 2 and the resonator portion 4, the PL wavelength at each point in the resonator portion 4 also increases toward the BJ connection portion as shown in FIG. 4. In a range within 100 μm from the BJ connection portion, in particular, the PL wavelength difference $\Delta\lambda_{PL}$ increases exponentially.

Figure 5:
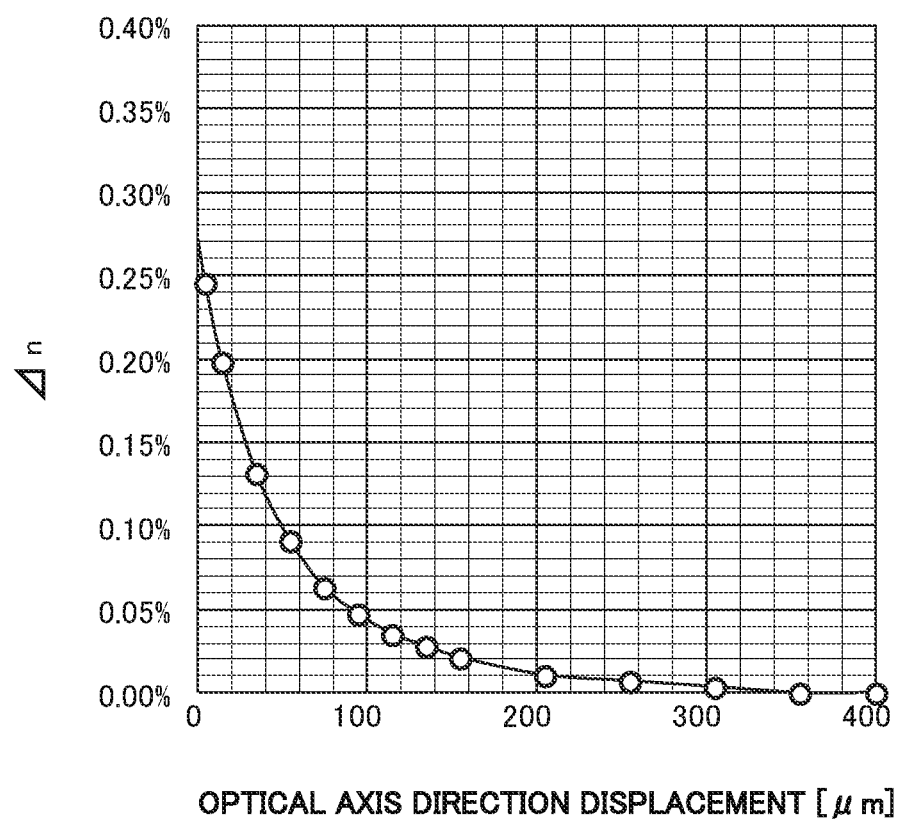
FIG. 5 is a graph showing the relation between optical axis direction displacement and an effective refraction index n in the optical semiconductor device that has a BJ connection portion.

FIG. 5 shows a relation between optical axis direction displacement and an effective refraction index difference Δn in the optical semiconductor device 1 which includes the modulator portion 2 and the resonator portion 4 and which has been manufactured through a BJ growth step. In FIG. 5, the optical axis direction displacement represented by the axis of abscissa is 0 at the connection portion between the modulator portion 2 and the resonator portion 4, and is expressed as the distance from the connection portion to the rear end side (the A' side). The effective refraction index n uses a value at the rear end (the A' side) as a reference, and the effective refraction index difference Δn represented by the axis of ordinate in FIG. 5 indicates a difference between the effective refraction index at a point of optical axis direction displacement and the effective refraction index at the rear end. The effective refraction index of the resonator portion 4 increases toward the BJ connection portion as shown in FIG. 5. In a range within 100 μm from the BJ connection portion, in particular, the effective refraction index difference Δn increases exponentially.

Figure 3:
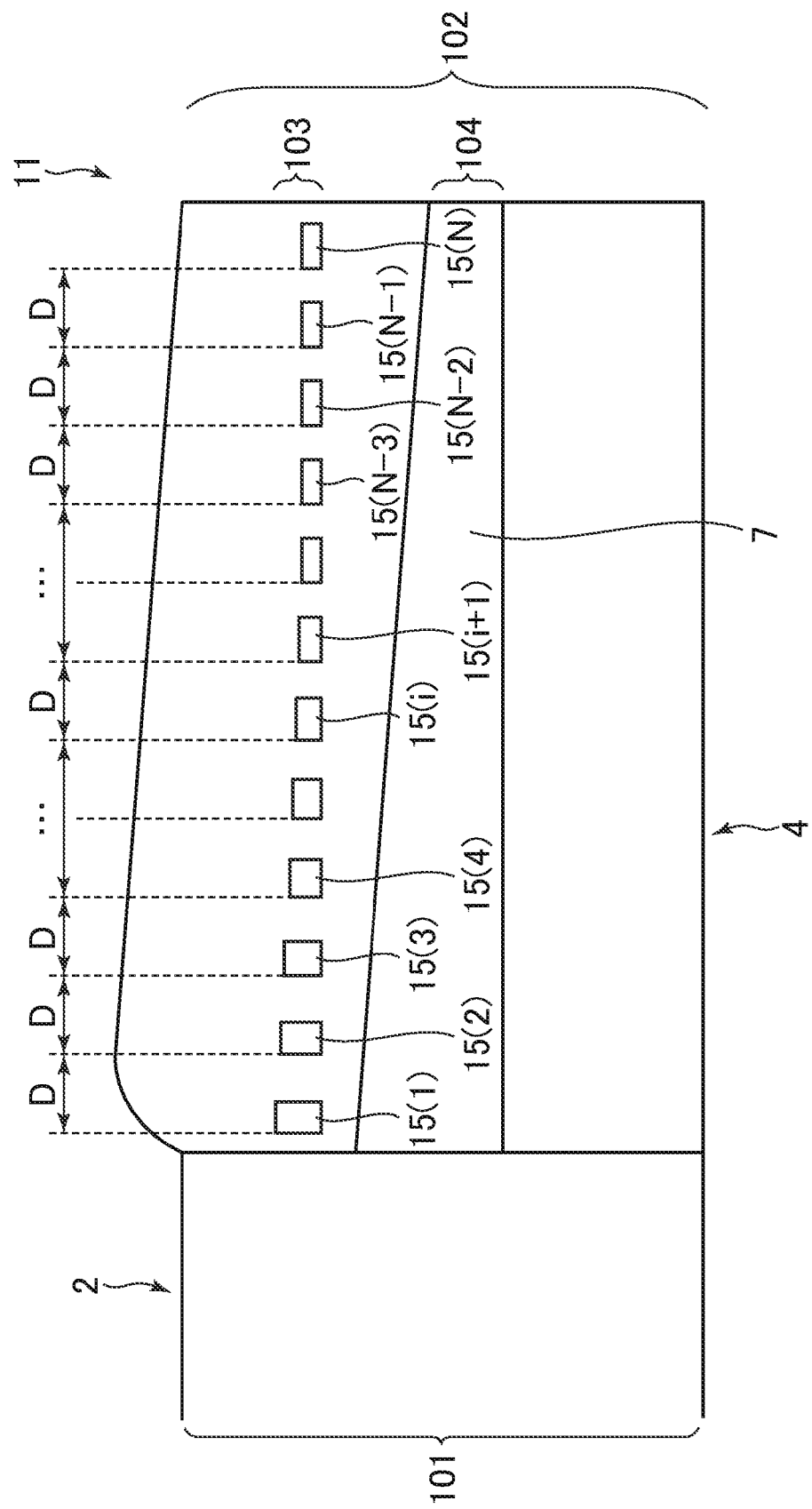
FIG. 3 is a diagram illustrating the pitch distance of each diffraction grating in a resonator portion of an optical semiconductor device according to a comparative example.

FIG. 3 is a sectional view outlining the resonator portion 4 that is included in an optical semiconductor device 11 according to a comparative example of the embodiments. The isolation layer is omitted from the sectional view of the optical semiconductor device 11 of FIG. 3. In FIG. 3, the resonator portion 4 includes a first semiconductor multilayer 101 (for example, an EA multilayer), a second semiconductor multilayer 102 (for example, an LD multilayer), a diffraction grating layer 103, and an active layer 104.

A plurality of diffraction gratings 15 formed in the diffraction grating layer 103 illustrated in FIG. 3 are denoted by 15(1), 15(2), ..., 15(N) in ascending order of distance from the modulator portion 2. Here, N represents an integer equal to or larger than 2. The magnitude of a pitch Λ of the diffraction gratings 15 according to the comparative example is constant (D) at each point.

When the effective refraction index is given as n and the diffraction grating pitch is given as Λ, the DFB wavelength $\lambda_{DFB}$ is expressed as $\lambda_{DFB}=2$ nΛ. In the case where the diffraction grating pitch Λ is uniform within the device as in the optical semiconductor device 11 according to the comparative example of FIG. 3, the DFB wavelength $\lambda_{DFB}$ which is expressed as 2 nΛ and which varies depending on the location with respect to the BJ connection portion is non-uniform because the effective refraction index n varies depending on the location from the BJ connection portion as shown in FIG. 5. Therefore, setting a constant diffraction grating pitch irrespective of the location with respect to the BJ connection portion (in other words, irrespective of the thickness of the LD multilayer) as in the optical semiconductor device 11 according to the comparative example can cause a drop in SMSR yield.

In the present invention, on the other hand, the diffraction grating pitch at each point in the resonator portion 4 is adjusted so that the DFB wavelength is constant at each point in the resonator portion 4. For instance, the DFB wavelength can be made uniform by setting the diffraction grating pitch at a point close to the BJ connection portion narrower than the diffraction grating pitch at a point far from the BJ connection portion, as opposed to the case where a constant diffraction grating pitch is set to each point in the resonator portion 4. The configuration of the diffraction gratings that are formed in the resonator portion 4 according to the present invention is described below by giving a concrete example.

Figure 2:
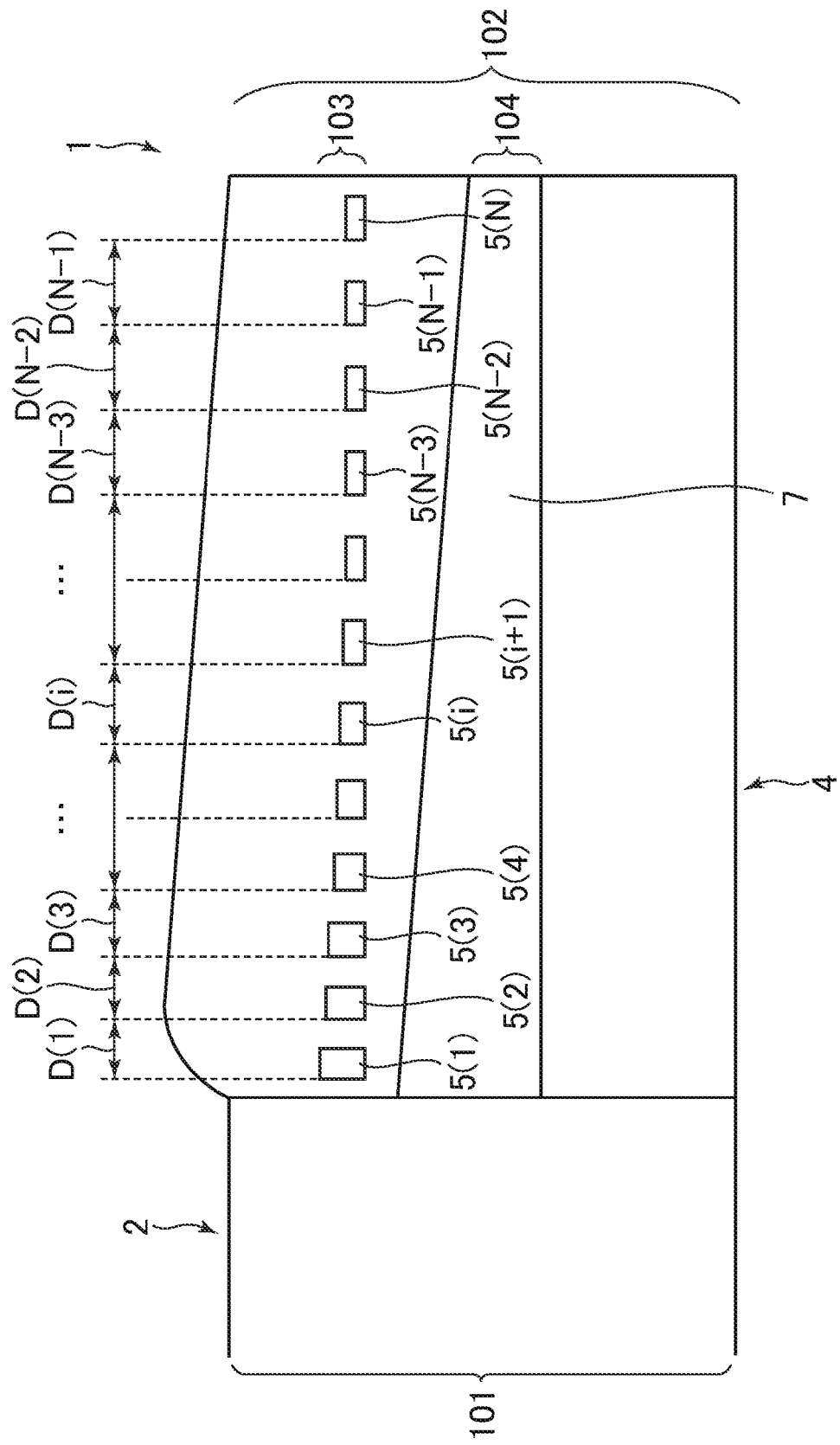
FIG. 2 is a diagram illustrating the pitch distance of each diffraction grating in a resonator portion of an optical semiconductor device according to a first embodiment of the present invention.

FIG. 2 is a sectional view outlining the resonator portion 4 that is included in an optical semiconductor device 1 according to a first embodiment of the present invention. The isolation layer is omitted from the sectional view of the optical semiconductor device 1 of FIG. 2 similarly to that of the optical semiconductor device 11 according to the comparative example. In FIG. 2, the resonator portion 4 includes a first semiconductor multilayer 101 (for example, an EA multilayer), a second semiconductor multilayer 102 (for example, an LD multilayer), a diffraction grating layer 103, and an active layer 104.

A plurality of diffraction gratings 5 formed in the diffraction grating layer 103 illustrated in FIG. 2 are denoted by 5(1), 5(2), ..., 5(N) in ascending order of distance from the modulator portion 2. Here, N represents an integer equal to or larger than 2. The magnitude of the distance (pitch) between the diffraction grating 5($i$) and the diffraction grating 5($i$+1) is represented by D(i), and i represents an integer equal to or larger than 1 and equal to or smaller than N−1. In the resonator portion 4 according to this embodiment, the diffraction grating pitch magnitude D(i) is varied depending on the distance from the BJ connection portion (in other words, depending on the active layer thickness of the resonator portion 4). For instance, there may be at least one diffraction grating pitch that satisfies a relation D(i)<D(j), where the integer i and an integer j satisfy 1≤i<j≤N. When the arbitrary integers i and j satisfy 1≤i<j≤N, the effective refraction index at the location of the diffraction grating 5($i$) is given as n(i), and the effective refraction index at the location of the diffraction grating 5($j$) is given as n(j), the pitches of the diffraction gratings may be set so as to satisfy |2n (i)D(i)−2n (j)D(j)|≤Th (Th is, for example, 2 nm).

In this manner, the DFB wavelength $\lambda_{DFB}$ can be made constant by setting the diffraction grating pitch Λ small in a place where the refraction index n is large. For instance, the diffraction grating pitch Λ may be varied from one diffraction grating to another in step with changes in effective refraction index shown in FIG. 5. The diffraction grating pitch magnitude D(i) of FIG. 2 in this case may be set as D(i)=$\lambda_{DFB}$/2ni, where ni represents an intermediate value between the effective refraction index at the diffraction grating 5($i$) and the effective refraction index at the diffraction grating 5($i$+1).

Figure 7:
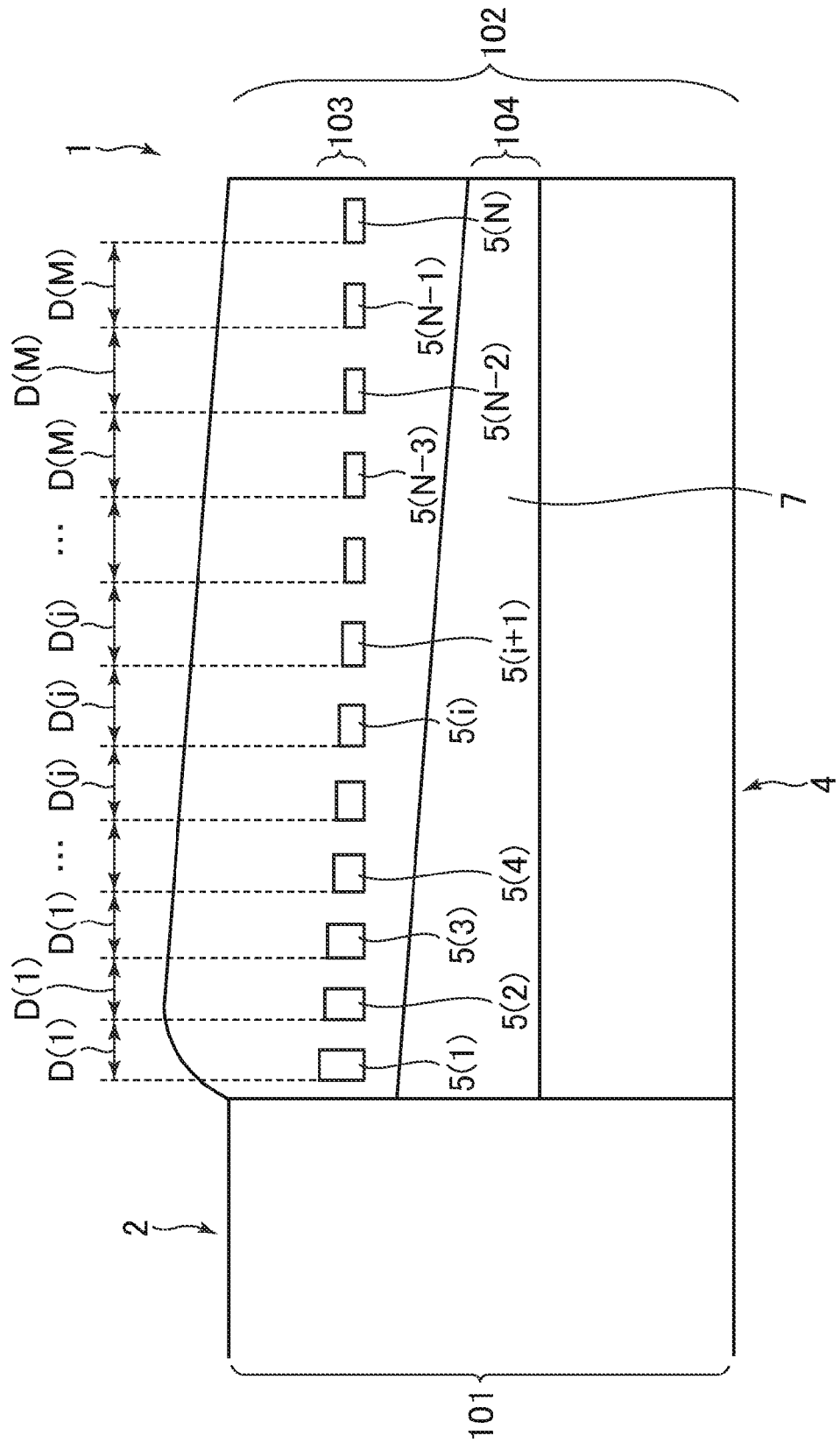
FIG. 7 is a diagram illustrating the pitch distance of each diffraction grating in a resonator portion of an optical semiconductor device according to a second embodiment of the present invention.

The diffraction grating pitch may also be changed in stages as in the optical semiconductor device 1 according to a second embodiment of the present invention which is illustrated in FIG. 7, instead of varying the pitch from one diffraction grating to another.

FIG. 7 is a sectional view outlining the resonator portion 4 that is included in an optical semiconductor device 1 according to the second embodiment. The optical semiconductor device 1 of the second embodiment illustrated in FIG. 7 has the same configuration as that of the optical semiconductor device 1 of the first embodiment illustrated in FIG. 2, except for the diffraction grating pitch. The difference from the first embodiment is described below.

In the example of the optical semiconductor device 1 according to the second embodiment which is illustrated in FIG. 7, the diffraction grating pitch is set in M stages (M is an integer smaller than N) instead of setting a different pitch to each diffraction grating. In such cases where the diffraction grating pitch is changed in stages, an intermediate-length pitch suited to the effective refraction index at the location may be set to a boundary between areas that have different diffraction grating pitches in order to reduce the rate of change per unit length of the effective refraction index (for example, a pitch common to K (K is an integer equal to or larger than 2) diffraction gratings which are to have the same pitch may be set based on an intermediate effective refraction index among effective refraction indices at the K diffraction gratings). An effect of improving the SMSR yield when the diffraction grating pitch is changed in stages has further been studied, and the study shows that a favorable SMSR yield can be secured when the number of areas having different pitches (i.e., M) is 3 or higher. The upper limit of the number of areas having different diffraction grating pitches (i.e., M) is desirably 10 or lower to avoid complicating the work of a diffraction grating forming step. In short, the diffraction grating pitch stage number M can be set as 3 or more and 10 or lower.

Figure 8:
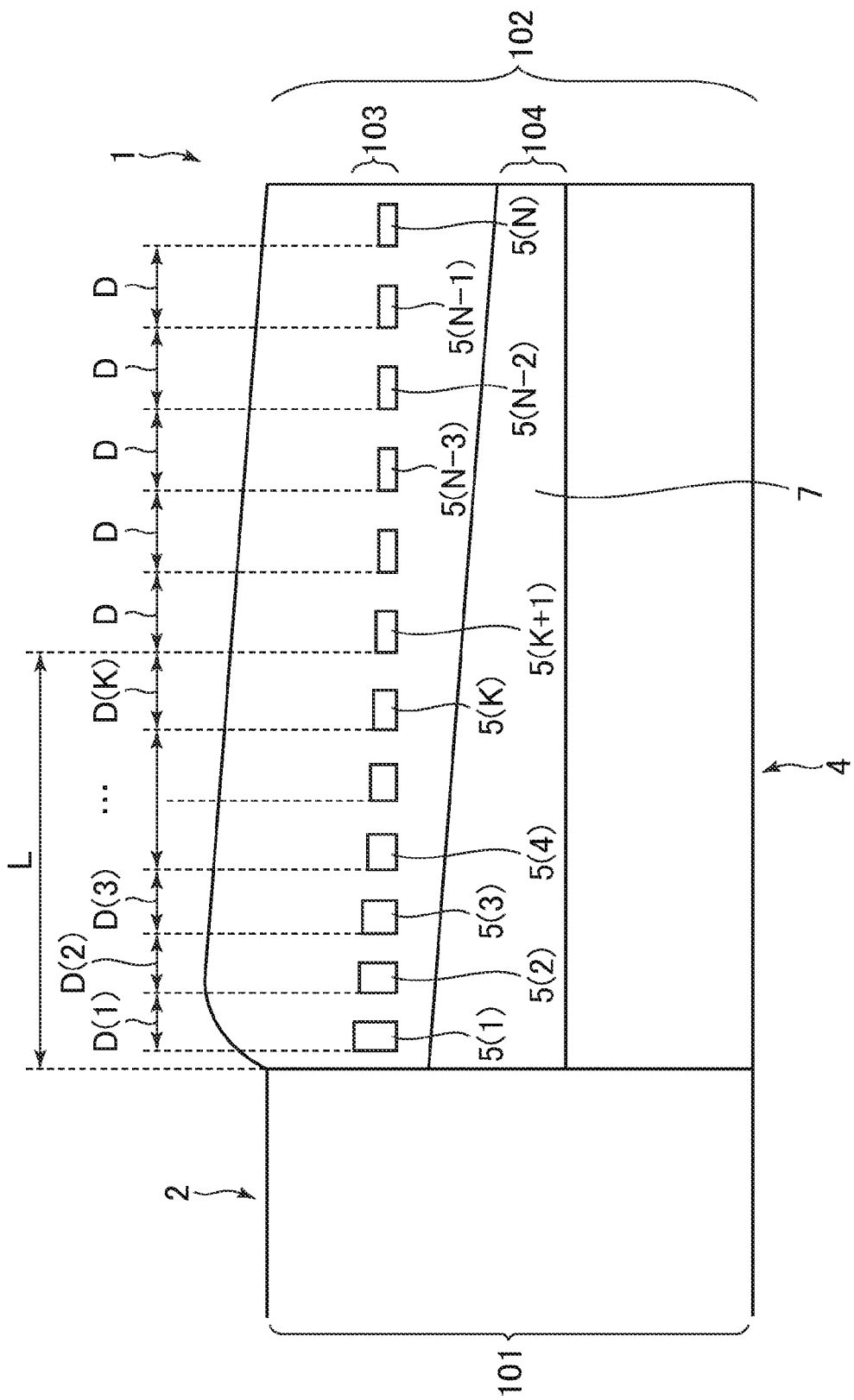
FIG. 8 is a diagram illustrating the pitch distance of each diffraction grating in a resonator portion of an optical semiconductor device according to a third embodiment of the present invention.

In addition, FIG. 8 is a sectional view outlining the resonator portion 4 that is included in an optical semiconductor device 1 according to a third embodiment of the present invention. The optical semiconductor device 1 of the third embodiment illustrated in FIG. 8 has the same configuration as that of the optical semiconductor device 1 of the first embodiment illustrated in FIG. 2, except for the diffraction grating pitch. The difference from the first embodiment is described below.

As illustrated in FIG. 8, in the optical semiconductor device 1 of the third embodiment, areas where the diffraction grating pitch is varied are contained within a range that measures L (L is approximately 200 μm, for example) from around the BJ connection portion, whereas in places farther than L from around the BJ connection portion (i.e., places farther than L from around the BJ connection portion and short of the rear end surface of the LD portion), a uniform diffraction grating pitch (regular intervals) is set. This idea focuses on the fact that changes in effective refraction index n in FIG. 5 substantially reach saturation by a point that is approximately 200 μm from the BJ connection portion. The third embodiment can thus make the areas where the diffraction grating pitch is varied smaller in size than in the first and second embodiments, and the number of stages in which the diffraction grating pitch is changed can be made lower than in the second embodiment.

Figure 9:
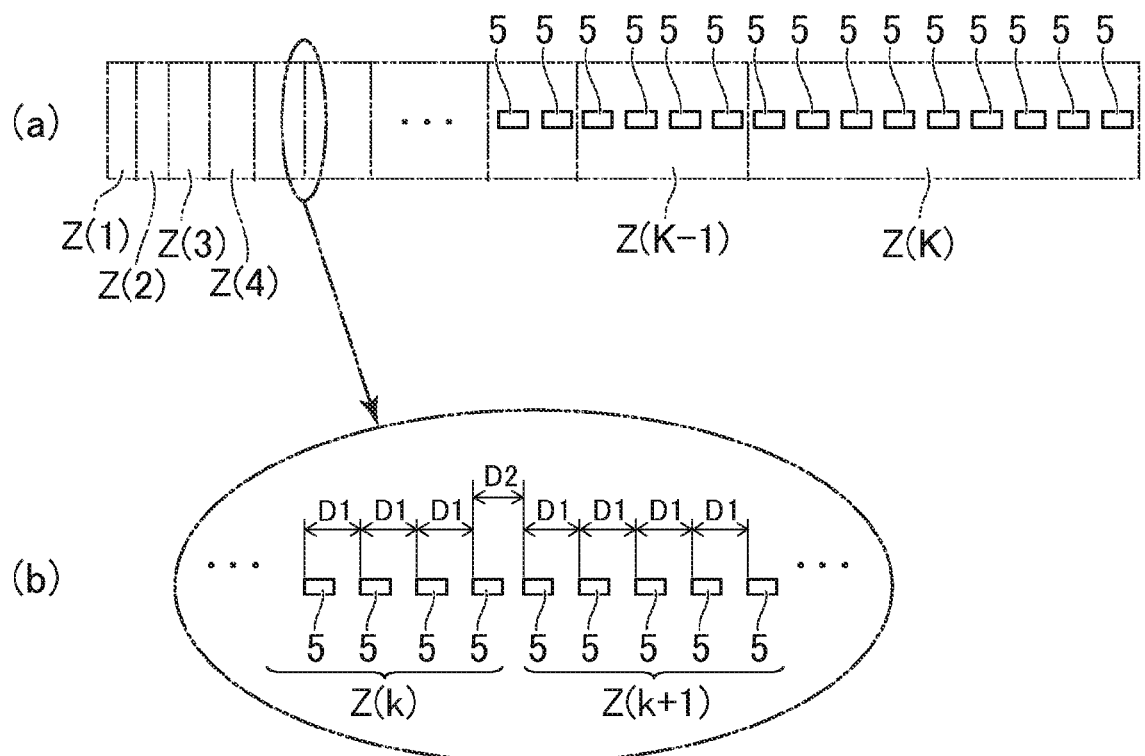
FIG. 9 is a diagram illustrating the pitch distances of the diffraction gratings in a resonator portion of an optical semiconductor device according to a fourth embodiment of the present invention.
Figure 10:
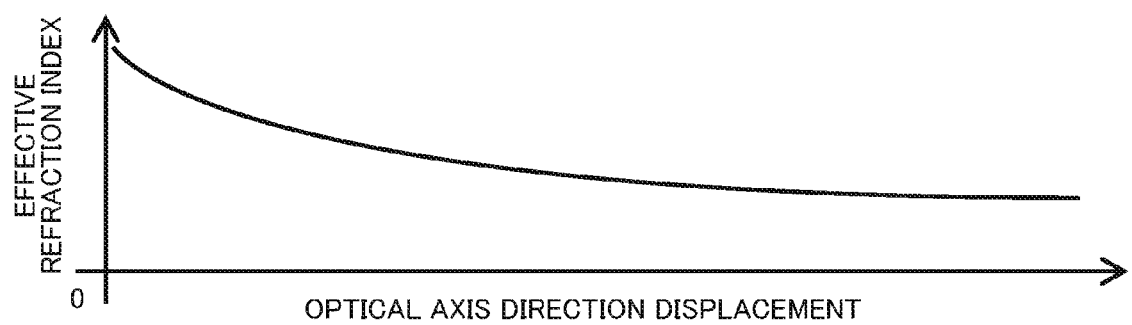
FIG. 10 is a graph showing the relation between optical axis direction displacement and an effective refraction index in the optical semiconductor device according to the fourth embodiment of the present invention.

FIG. 9 is a diagram illustrating the pitch distances of the diffraction gratings in the resonator portion 4 of the optical semiconductor device 1 according to a fourth embodiment of the present invention. FIG. 10 is a graph showing the relation between optical axis direction displacement and an effective refraction index in the optical semiconductor device 1 according to the fourth embodiment of the present invention.

Similarly to FIG. 5, as shown in FIG. 10, the optical axis direction displacement represented by the axis of abscissa is 0 at the connection portion (BJ connection portion) between the modulator portion 2 and the resonator portion 4, and is expressed as the distance from the connection portion (one end) to the rear end (another end) side. The effective refraction index of the resonator portion 4 increases exponentially toward the connection portion as shown in FIG. 10. That is, the effective refraction index decreases from the one end (connection portion) to the another end (rear end) along the optical axis of the waveguide, similarly to FIG. 5.

The diffraction grating pitches in the optical semiconductor device 1 according to the fourth embodiment of the present invention may be different from the ones in the optical semiconductor device 1 according to the first to third embodiments of the present invention. The optical semiconductor device 1 of the fourth embodiment illustrated in FIG. 9 has the same configuration as that of the optical semiconductor device 1 of the first embodiment illustrated in FIG. 2, except for the diffraction grating pitches. The difference from the first embodiment is described below.

FIG. 9 (a) is a plan view of a plan view illustrating an arrangement of the diffraction gratings 5 according to the fourth embodiment. As shown in FIG. 9 (a), the diffraction gratings 5 are classified into K areas (zones), Z(1) to Z(K), from the one end (connection portion) to the another end (rear end) along the optical axis of the waveguide. Here, K represents an integer equal to or larger than 3, while N for the number of the diffraction gratings 5 in the fourth embodiment represents an integer equal to or larger than 6. The fourth embodiment shows an example in the case K is 33.

FIG. 9 (b) is a plan view of a plan view illustrating an arrangement of the diffraction gratings 5 at the adjacent areas, Z(k) and Z (k+1), where k is an arbitrary integer satisfying 1≤k≤K−1. The diffraction pitches of the diffraction gratings that are formed in the areas, Z(1) to Z(K) are D1, which represents a magnitude of a pitch in each of the areas. Here, D1 is 200 nm. On the other hand, the diffraction pitches at the adjacent diffraction gratings that are formed at boundaries between the adjacent areas, Z(1) and Z(2), Z(2) and Z(3), . . . , and Z(K−1) and Z(K) are D2, which represents a magnitude of a pitch at each of the boundaries. Here, D2 is 198 nm, that is, D2 is shorter than D1 by λ/100, where the difference is called λ/100 shift.

Here, the waveguide includes a first area, a second area being adjacent to the first area, and a third area being adjacent to the second area. When the area Z(k) where k satisfies 1≤k≤K−2 is defined as the first area, the area Z(k+1) could be defined as the second area which is adjacent to the first area. As shown in FIG. 10, the effective refraction index in the area z(k) is larger than the effective refraction index in the area z(k+1). Similarly to the first embodiment as shown in FIG. 2, the thickness in the area Z (k) is larger than the thickness in the are Z(k+1). The pitch D2 at the adjacent gratings at the boundary between the areas, Z(k) and Z(k+1) is narrower both than pitches D1 of the diffraction gratings in the area Z(k) and than pitches D1 of the diffraction gratings in the area Z(k+1).

The area Z(k+2) could be defined as the third area which is adjacent to the second area. Similarly, the effective refraction index in the area z(k+1) is larger than the effective refraction index in the area z(k+2) and the thickness in the area Z(k+1) is larger than the thickness in the are Z(k+2). The pitch D2 at the adjacent gratings at the boundary between the areas, Z(k+1) and Z (k+2) is narrower both than pitches D1 of the diffraction gratings in the area Z (k+1) and than pitches D1 of the diffraction gratings in the area Z(k+2).

That is, the pitches of the diffraction gratings in the area Z(k) are all D1 and uniform, the pitches of the diffraction gratings in the area Z(k+1) are all D1 and uniform, and the pitches of the diffraction gratings in the area Z(k+2) are all D1 and uniform. Each of the pitches of the diffraction gratings in the areas Z(k), Z(k+1), and Z(k+2) is equal to each other as D1. The pitches at the adjacent gratings at the boundaries between the adjacent areas are all D2 and uniform. The diffraction gratings are drawn with two types of diffraction grating pitches, D1 and D2.

Numbers of the diffraction gratings included in the areas, Z(1) to Z(K) are, respectively, 7, 8, 8, 9, 10, ..., 57, 77, 118, and 1216. That is, the number of the diffraction gratings included in the area Z(k) is equal to or smaller than the number of the diffraction gratings included in the area Z (k+1), where k satisfies 1≤k≤K−1.

In this embodiment, the numbers of the diffraction gratings included in the three adjacent area Z(k), Z(k+1), and Z(k+2) where k satisfies 3≤k≤K−2 decrease in this order.

Since the absolute value of the slope of the effective refraction index is large in a range k is small, e.g. 1~10, that is, in a region close to the connection portion (BJ connection portion), a length of the area Z(k) is short and the number of the diffraction gratings included in the area Z(k) is small. On the other hand, since the absolute value of the slope of the effective refraction index is small in a range k is large, e.g. K−5~K, that is, in a region close to the rear end (another end), the length of the area Z(k) is long and the number of the diffraction gratings included in the area Z(k) is large.

A density (or frequency) of the boundaries of the adjacent areas decreases from the one end (connection portion) to the another end (rear end) along the optical axis of the waveguide. That is, a density (or frequency) of the λ/100 shifts decreases from the one end (connection portion) to the another end (rear end) along the optical axis of the waveguide.

The optical semiconductor device 1 according to the fourth embodiment may realize that the effective pitch of the diffraction grading decreases or keeps uniform from the one end to the another end along the optical axis of the waveguide, and that a photoluminescence wavelength $\lambda_{PL}$ decreases similarly to FIG. 4. In the fourth embodiment, the effective pitch of the diffraction grading at least partially decreases from the one end to the another end along the optical axis of the waveguide. An averaged pitch over the first area and the second area is shorter than an averaged pitch over the second area and the third area. An photoluminescence wavelength averaged over the first area and the second area is longer than an photoluminescence wavelength averaged over the second area and the third area. That is, this effect according to the fourth embodiment is substantially common to the effects of the first to third embodiments.

The amount of the phase shift is not limited to 1/100 phase shift. The number of the areas (K value) and the amount of the phase shift may be changed according to limitation of drawing devices and/or operations of drawing program. The amount of the phase shift could be increased up to 1/20 phase shift (λ/20 shift) to realized an acceptable optical semiconductor resonator.

In the first to third embodiments, the diffraction grating pitch is changed frequently. When the diffraction grating pitch is changed, calibration of an electron-beam deflection coil is required. On the other hand, in the fourth embodiment, the diffraction gratings are drawn by shifting drawing positions. The calibration may not be required frequently comparing to the first to third embodiments and a drawing period could be reduced.

FIG. 9 shows the example of two types of pitches, D1 and D2. The pitches at the boundary of the adjacent areas are D1 (=200 nm), D2 (=198 nm), D1 (=200 nm). However, the present invention is not limited to the two types of pitches. Three types of pitches could be used to draw the diffraction gratings. The pitches at the boundary between the adjacent areas may be D1 (=200 nm), D2 (=199 nm), D3 (=198 nm), D2 (=199 nm), D1 (=200 nm).

When the areas Z(k) and Z(k+1) are defined as the first and second areas, respectively, the pitch at the boundary between the areas Z(k) and Z(k+1) is D3. In the area Z(k), the pitch between the adjacent diffraction grating at each of two ends (closest to the areas Z(k−1) and Z (k+1)) is D2, the pitches among the rest of the diffraction gratings included in the area Z(k) are D1. The rest of the diffraction gratings are located farther to the areas Z(k−1) and Z(k+1) than the adjacent diffraction gratings at the ends, respectively. The pitches in the other areas are the same as the pitches in the area Z(k). In this case, in the first area, a pitch (D2) between the diffraction grating closest to the second area and the diffraction grading second closest to the second area is wider than the pitch (D3) at the adjacent diffraction gratings at the boundary between the first area and the second area and is narrower than pitches (D1) of the diffraction gratings that are located farther to the second area. More than three types of pitches at the boundary may be used.

Figure 6:
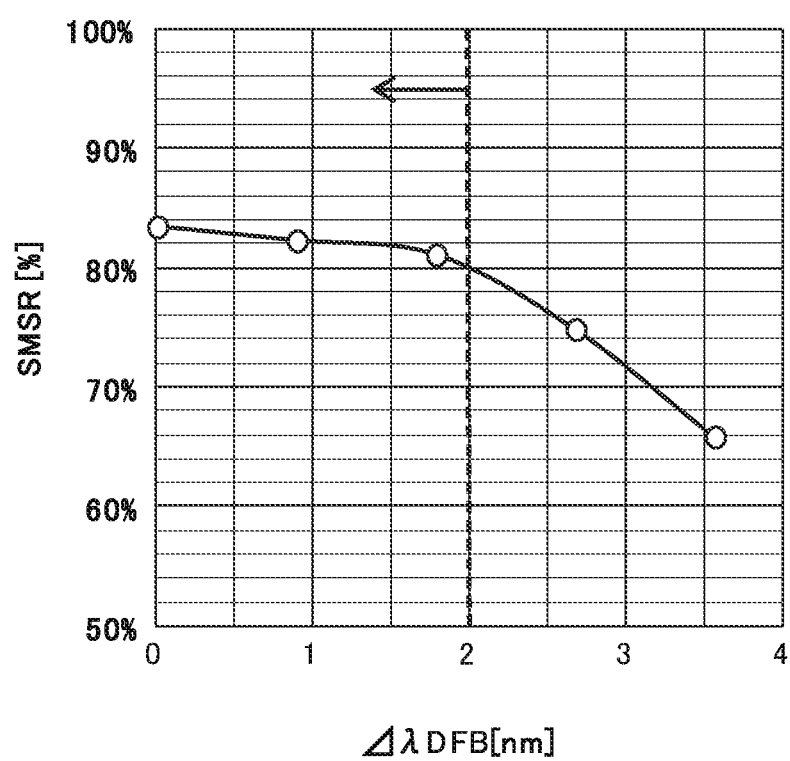
FIG. 6 is a graph showing the relation between a DFB wavelength difference $\Delta\lambda_{DFB}$ and the SMSR yield in the optical semiconductor device according to the embodiments of the present invention.

FIG. 6 shows a relation between the DFB wavelength difference $\Delta\lambda_{DFB}$ and the SMSR yield in the optical semiconductor device according to the embodiments of the present invention. Here, $\Delta\lambda_{DFB}$ represents the wavelength width of laser light emitted by the optical semiconductor device 1. In the case of the comparative example of FIG. 3, for example, $\Delta\lambda_{DFB}$ is expressed as 2×n(1)×D−2×n(N)×D, where n(1) represents the effective refraction index of an area that is closest to the BJ connection portion, and n(N) represents the effective refraction index of an area that is farthest from the BJ connection portion. The relation shown in FIG. 6 is the result of a calculation based on the performance in terms of the DFB wavelength difference $\Delta\lambda_{DFB}$ of the 1.55 μm-band, modulator-integrated, optical semiconductor device 1 that has actually been manufactured. The calculation has been performed under a condition in which the diffraction grating pitch is changed in eight stages in step with changes in effective refraction index to decrease the DFB wavelength difference $\Delta\lambda_{DFB}$.

In the relation of FIG. 6, a point where the DFB wavelength difference $\Delta\lambda_{DFB}$ is maximum (3.56, 65.8%) is the performance of a pre-countermeasure device (i.e., the optical semiconductor device 11 that has the diffraction grating configuration of FIG. 3). The SMSR yield is minimum at this point and improves as the DFB wavelength difference $\Delta\lambda_{DFB}$ decreases. It is expected that, when the DFB wavelength difference $\Delta\lambda_{DFB}$ is 2 nm or less, in particular, the objective SMSR yield which is 80% is exceeded and substantially reaches saturation, where the yield is substantially equal to the one when the DFB wavelength difference $\Delta\lambda_{DFB}$ is zero (when $\Delta\lambda_{DFB}$ DFB is optimized).

It should be understood that the present invention is not limited to the embodiments described above, and may be subject to various changes, modifications, or substitutions that could be made by those with regular knowledge in the field. For instance, the wavelength range that can be used is not limited to 1.55 μm, and the same effects are obtained in the 1.3 μm-band and other wavelengths used in optical communication. The present invention is also applicable to distributed Bragg reflector (DBR) lasers, and the optical semiconductor device 1 integrated with a resonator is not limited to an EA modulator and may be a phase modulator, a phase regulator, or an amplifier. The present invention is further applicable to a case where the multilayer of the LD portion is thinner near the BJ connection portion. In this case, the DFB wavelength $\lambda_{DFB}$ can be made constant by increasing the diffraction grating pitch near the BJ connection portion.

The optical semiconductor device 1 according to the present invention may be mounted to an optical module for outputting an optical signal that has been modulated as instructed by a transmission signal input to the modulator 2.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical semiconductor resonator, comprising:
   a waveguide which comprises a first area and a second area adjacent to the first area where an effective refraction index and a thickness vary in an optical axis direction of the wave guide; and
   diffraction gratings formed along the optical axis direction of the waveguide,
   wherein the effective refraction index in the first area is larger than the effective refraction index in the second area, and the thickness in the first area is larger than the thickness in the second area,
   wherein a pitch at the adjacent diffraction gratings at a boundary between the first area and the second area is narrower than a plurality of pitches of the diffraction gratings that are formed in the first area and narrower than a plurality of pitches of the diffraction gratings that are formed in the second area, and
   wherein a number of the diffraction gratings included in the first area is smaller than a number of the diffraction gratings included in the second area.

2. The optical semiconductor resonator according to claim 1,
   wherein the pitches of the diffraction gratings in the first area are uniform and the pitches of the diffraction gratings in the second area are uniform.

3. The optical semiconductor resonator according to claim 1,
   wherein the pitches of the diffraction gratings in the first area and the pitches of the diffraction gratings in the second area are uniform.

4. The optical semiconductor resonator according to claim 1,
   wherein, in the first area, a pitch between the diffraction grating closest to the second area and the diffraction grading second closest to the second area is wider than the pitch at the adjacent diffraction gratings at the boundary between the first area and the second area and is narrower than the pitches of the diffraction gratings that are located farther from the second area.

5. The optical semiconductor resonator according to claim 1,
   wherein the waveguide further comprises a third area adjacent to the second area where an effective refraction index and a thickness vary in the optical axis direction of the wave guide,
   wherein the effective refraction index in the third area is smaller than the effective refraction index in the second area, and the thickness in the third area is smaller than the thickness in the second area, and
   wherein a pitch at adjacent diffraction gratings at a boundary between the second area and the third area is narrower than the pitches of the diffraction gratings that are formed in the second area and narrower than a plurality of pitches of the diffraction gratings that are formed in the third area.

6. The optical semiconductor resonator according to claim 5,
   wherein the number of the diffraction gratings included in the second area is smaller than a number of the diffraction gratings included in the third area.

7. The optical semiconductor resonator according to claim 5,
   wherein an average of the pitches over the first area and the second area is shorter than an average of the pitches over the second area and the third area.

8. The optical semiconductor resonator according to claim 1, further comprising:
   a mesa stripe structure along the waveguide.

9. The optical semiconductor resonator according to claim 1, wherein a difference in emission wavelength between a front end of the waveguide and a rear end of the waveguide is within ±2 nm.

10. An optical semiconductor device, comprising:
    an optical semiconductor resonator; and
    an optical modulator connected to the optical semiconductor resonator by a butt-joint structure,
    wherein the optical semiconductor resonator includes:
       a waveguide which comprises a first area and a second area adjacent to the first area where an effective refraction index and a thickness vary in an optical axis direction of the wave guide, and
       diffraction gratings formed along the optical axis direction of the waveguide,
    wherein the effective refraction index in the first area is larger than the effective refraction index in the second area, and the thickness in the first area is larger than the thickness in the second area,
    wherein a pitch at the adjacent diffraction gratings at a boundary between the first area and the second area is narrower than a plurality of pitches of the diffraction gratings that are formed in the first area and narrower than a plurality of pitches of the diffraction gratings that are formed in the second area, and
    wherein a number of the diffraction gratings included in the first area is smaller than a number of the diffraction gratings included in the second area.

11. The optical semiconductor device according to claim 10, wherein, in the optical semiconductor resonator, the first area is closer to a connection portion connecting to the optical modulator than the second area.

12. The optical semiconductor device according to claim 11,
    wherein, in the optical semiconductor resonator, the waveguide further comprises a third area adjacent to the second area where an effective refraction index and a thickness vary in an optical axis direction of the wave guide, and
    wherein the effective refraction index in the third area is smaller than the effective refraction index in the second area, and the thickness in the third area is smaller than the thickness in the second area, and
    wherein a pitch at the adjacent diffraction gratings at a boundary between the second area and the third area is narrower than the pitches of the diffraction gratings that are formed in the second area and narrower than a plurality of pitches of the diffraction gratings that are formed in the third area.

13. The optical semiconductor device according to claim 12,
wherein an average of the pitches over the first area and the second area is shorter than an average of the pitches over the second area and the third area.

\* \* \* \* \*